(12) United States Patent
Zurutuza Elorza et al.

(10) Patent No.: US 10,354,866 B2
(45) Date of Patent: Jul. 16, 2019

(54) EQUIPMENT AND METHOD TO AUTOMATICALLY TRANSFER A GRAPHENE MONOLAYER TO A SUBSTRATE

(71) Applicant: GRAPHENEA, S.A., San Sebastian (ES)

(72) Inventors: Amaia Zurutuza Elorza, Gipuzkoa (ES); Alba Centeno Perez, Gipuzkoa (ES); Beatriz Alonso Rodriguez, Gipuzkoa (ES); Amaia Pesquera Rodriguez, Bizkaia (ES); Jesus De La Fuente Cosio, Araba (ES)

(73) Assignee: GRAPHENEA, S.A., San Sebastian (ES)

( * ) Notice: Subject to any disclaimer, the term of this patent is extended or adjusted under 35 U.S.C. 154(b) by 259 days.

(21) Appl. No.: 14/809,672

(22) Filed: Jul. 27, 2015

(65) Prior Publication Data
US 2017/0032962 A1   Feb. 2, 2017

(51) Int. Cl.
| H01L 21/02 | (2006.01) |
| H01L 21/67 | (2006.01) |
| H01L 21/04 | (2006.01) |
| C23C 16/01 | (2006.01) |
| C23C 16/26 | (2006.01) |
| C01B 32/194 | (2017.01) |
| H01L 29/16 | (2006.01) |

(52) U.S. Cl.
CPC ...... *H01L 21/02527* (2013.01); *C01B 32/194* (2017.08); *C23C 16/01* (2013.01); *C23C 16/26* (2013.01); *H01L 21/02118* (2013.01); *H01L 21/6708* (2013.01); *H01L 21/67253* (2013.01); *H01L 21/02491* (2013.01); *H01L 21/02664* (2013.01); *H01L 29/1606* (2013.01)

(58) Field of Classification Search
None
See application file for complete search history.

(56) References Cited

U.S. PATENT DOCUMENTS

| 6,497,785 B2 * | 12/2002 | Huang .............. H01L 21/67086 134/1.3 |
| 6,780,277 B2 * | 8/2004 | Yokomizo ......... H01L 21/67086 156/345.11 |

(Continued)

FOREIGN PATENT DOCUMENTS

| WO | 2013048063 A1 | 4/2013 |
| WO | 2013144640 A1 | 10/2013 |

OTHER PUBLICATIONS

Junmo Kang, et al., Graphene Transfer: Key for Applications, Nanoscale, vol. 4, No. 18, 2012.

(Continued)

*Primary Examiner* — Sylvia MacArthur
(74) *Attorney, Agent, or Firm* — Lucas & Mercanti, LLP

(57) ABSTRACT

Equipment to automatically transfer a graphene monolayer deposited on a metal layer and protected with a polymer layer to a substrate, comprising at least one liquid inlet, at least one sensor to control the level and pH of the liquids, at least one liquid outlet to drain the liquids, a stirring element to homogenise the liquid mixture and a ramp to feed in the substrate and method to automatically transfer a graphene monolayer to a substrate, which uses said equipment.

2 Claims, 5 Drawing Sheets

(56) References Cited

U.S. PATENT DOCUMENTS

| | | | |
|---|---|---|---|
| 7,341,634 B2* | 3/2008 | Yokoyama | C23C 18/1619 |
| | | | 118/429 |
| 7,402,521 B2* | 7/2008 | Matsui | B24B 37/044 |
| | | | 156/345.12 |
| 2003/0131938 A1* | 7/2003 | Kobayashi | B24B 37/04 |
| | | | 156/345.12 |
| 2009/0095323 A1* | 4/2009 | Jung | H01L 21/67086 |
| | | | 134/18 |
| 2011/0070146 A1 | 3/2011 | Song et al. | |
| 2011/0200787 A1 | 8/2011 | Regan et al. | |
| 2012/0244358 A1 | 9/2012 | Lock et al. | |
| 2012/0258311 A1 | 10/2012 | Hong et al. | |
| 2017/0032962 A1* | 2/2017 | Zurutuza Elorza | |
| | | | H01L 21/02527 |

OTHER PUBLICATIONS

Xuelei Liang, et al., Toward Clean and Crackless . . . , ACS Nano, vol. 5, No. 11, 2011.
European Search Report corresponding to EP14382148.6, dated Oct. 16, 2014.

* cited by examiner

EQUIPMENT AND METHOD TO AUTOMATICALLY TRANSFER A GRAPHENE MONOLAYER TO A SUBSTRATE

FIELD OF THE INVENTION

The present invention relates to carbon nano-structures and also to the manufacture or treatment of nano-structures. Particularly, the present invention relates to graphene and methods of manufacturing monolayers of graphene.

BACKGROUND OF THE INVENTION

Methods to produce high quality graphene (electronic/optoelectronic grade) include the silicon carbide (SiC) sublimation and the chemical vapour deposition (CVD). CVD is the manufacturing method with the greatest potential for future high quality large area graphene production. Graphene manufactured by CVD is expected to have a broad range of applications starting from electronics, optoelectronics, photonics, touch screen and display technology, and up to lighting to mention just a few.

Graphene can be manufactured using CVD methods on top of metal catalysts such as copper or nickel. The synthesis of monolayer graphene can be much better controlled using copper as the catalyst as opposed to nickel. Metal catalysts can be used in the form of foils or thin films deposited over other substrates. Graphene is typically formed within the CVD reactor at relatively high temperatures between 600° C. and up to 1000° C. and using gaseous carbon sources such as methane, ethylene or acetylene. Solid and liquid carbon sources can also be utilised, however the delivery of gases is more convenient and easier to control.

In order to make graphene suitable to be integrated in industrial processes it has to be transferred onto arbitrary substrates. This so-called transfer method involves the removal/detachment of the metal catalyst followed by placing the graphene on the final substrate. It is extremely important that the graphene film is intact, not damaged and retains all the required properties after the transfer process. Consequently, graphene should not be folded, broken or detached from the substrate and should be well positioned on it.

US20120244358A1 discloses a dry transfer method where the graphene film is directly transferred onto arbitrary substrates using direct printing methods. However, chemical modification of the receiving substrate is required and this could modify the properties of the graphene material. A homogeneous chemical modification of the substrate could be quite difficult to obtain and this could have a negative impact on the final graphene properties. In addition, this method is not suitable for large area monolayer graphene film (76 mm and above) transfer. The complete transfer printing to obtain close to 100% monolayer graphene on the final substrate would be extremely difficult.

US20110070146A1 discloses a manual wet transfer method where the graphene film along with the metal catalyst is separated from a silicon dioxide/silicon ($SiO_2$/Si) substrate by applying a predetermined force or radiating ultrasonic waves in water. These wet transfer methods could damage the graphene layer since it is atomically thin.

US20120258311A1 discloses a roll based transfer method. This roll based method is adequate for flexible substrates; however that transfer method is not suitable for rigid substrates.

US20110200787A1 discloses another wet transfer method suitable for transferring very small graphene samples onto transmission electron microscopy (TEM) grids of 3 mm in diameter. The graphene is not protected with a sacrificial polymer layer and it is attached onto the TEM grid by the addition of a few drops of solvent. The graphene can easily break and get irreversibly damaged using this method. Consequently, this method is limited to very small samples (<3 mm discs).

In the graphene transfer methods of the prior art, graphene is manipulated manually. In addition, said methods are also limited to relatively small graphene area samples. Furthermore, standard laboratory glassware containers are used for the wet transfer of the graphene samples. The manual manipulation of graphene is extremely difficult and leads to low production yields due to operator related errors. The manipulation of a one atom thick film is not a trivial matter at all.

The technical problem to be solved can be seen in the provision of an automated graphene transfer method that includes tailor made equipment developed for the graphene transfer process and described herein, that increases production yield, reliability and reproducibility with respect to manual graphene transfer methods of the prior art.

A solution to this problem is provided by the method and equipment as defined in the claims of the present application.

DESCRIPTION OF THE INVENTION

A preferred embodiment of the invention is an equipment to automatically transfer a graphene monolayer (1) deposited on a metal layer (2) and protected with a polymer layer (3) to a substrate (4), comprising at least one liquid inlet (5), at least one sensor (6) to control the level and pH of the liquids, at least one liquid outlet (7) to drain the liquids, a stirring element (11) to homogenise the liquid mixture and a ramp (8) to feed in the substrate (4), in the following, equipment of the invention.

A particular embodiment is the equipment of the invention, further comprising a shower (9) to dispense the liquids and support points (10) to fix the substrate.

An example of the equipment of the invention is shown in FIGS. 3 and 4.

A preferred embodiment of the invention is a method to automatically transfer a graphene monolayer (1) deposited on a metal layer (2) and protected with a polymer layer (3) to a substrate (4), comprising the steps of:

(a) etching the metal layer (2) by pouring a metal etching solution into an equipment according to claim 1, by opening a computer-controlled valve (13) and placing said graphene monolayer (1) on top of said metal etching solution, (b) eluting the liquid present in said equipment by opening a computer-controlled valve (14) and pouring a neutralising solution by opening a computer-controlled valve (15), (c) eluting the liquid present in said equipment by opening the computer-controlled valve (14) and pouring an acidic solution by opening a computer-controlled valve (16) and (d) inserting said substrate (4) into said equipment through the ramp (8), eluting the liquid present in said equipment by opening the computer-controlled valve (14) and depositing the graphene monolayer (1) on said substrate (4), in the following, method of the invention.

FIG. 1 shows a diagram of a graphene production method by chemical vapour deposition (CVD), graphene monolayer transfer according to the method of the invention and further removal of the polymethyl methacrylate (PMMA) polymer layer (3).

The method of the invention is a method to transfer a graphene monolayer to a substrate in a reliable, reproducible, scaled up and cost effective manner. The method of the invention is suitable to produce wafer scale graphene from 25 mm up to 450 mm on flexible and rigid substrates. However, it is not limited to large samples; it could also be used to transfer small samples from a few millimetres and up to 25 mm. In addition, the chemical modification of the graphene films such as doping and the production of multilayer graphene samples could be performed. Moreover, the removal of the sacrificial polymer layer could also be achieved in situ with the method and equipment of the invention.

The conductivity of graphene could be further augmented by increasing the number of graphene monolayers by repeating the steps of the method and using the equipment of the invention. Increasing the number of graphene monolayers is useful for transparent electrodes (low sheet resistance values are required for said devices). By repeating the steps of the method of the invention the sheet resistance is decreased by a few orders of magnitude.

Thus, another embodiment is the method of the invention, wherein the number of graphene monolayers (1) deposited on the substrate (4) is increased to at least 2 by repeating the steps (a)-(d) of the method of the invention. In a particular embodiment, the number of graphene monolayers (1) deposited on the substrate (4) is from 2 to 4

In the method of the invention, graphene transfer times can be shortened considerably without jeopardising graphene quality. The transfer of the graphene monolayer to a substrate can take below one hour, whereas typical transfer methods can take between 6 and 12 hours.

The method of the invention can be performed close to room temperature or at elevated temperatures. Solutions could be heated up to 100° C. if required depending on the boiling point of the solvent.

The method and equipment of the invention are readily up scalable and simple to integrate into existing manufacturing processes. In addition, the processing time and volume of the various solutions (metal etchant, cleaning solvent, etc) can be minimised to reasonably low levels while the method still performs extremely well and high quality graphene can be obtained on the desired substrate. Furthermore, the method and equipment of the invention provides very high yields due to the fact that they maintain the graphene properties and structure intact by minimising foldings, holes, presence of impurities and detachment from the substrate.

Prior to the transfer of the graphene monolayer to a substrate, the graphene could be produced in a CVD reactor using metal catalysts in the form of foils or thin films on top of other substrates such as silicon wafers. The thin film metal catalysts can be deposited using sputtering or evaporation techniques. In the case of the metal foils, graphene grows on both sides of the catalyst surface and as a consequence the bottom graphene layer has to be eliminated if monolayer graphene is the required product. The removal of the unwanted graphene layer could be performed by attaching an adhesive polymer tape to the bottom graphene layer followed by thermal activation in order to remove the polymer and the unwanted graphene layer.

After the graphene is grown on a metal foil catalyst, the graphene layer is protected using a sacrificial polymer layer such as polymethyl methacrylate (PMMA), polydimethyl siloxane (PDMS), polycarbonate (PC), etc. The polymer layer can be applied using different methods for instance drop casting, spin coating, spraying, etc.

As a result of these processes, the graphene monolayer is deposited on a metal layer or an alloy layer and protected with a polymer layer.

Another embodiment is the method of the invention, wherein the automatic transfer of the graphene monolayer (1) deposited on a metal layer (2) and protected with a polymer layer (3) to a substrate (4) is controlled by a computer controlled unit that controls the liquid handling, etching of the metal layer (2) and positioning of the graphene monolayer (1) on the substrate (4).

In step (a) of the method of the invention, a metal etching solution is poured into the equipment of the invention by opening a computer-controlled valve (13). Once the filling is complete the graphene monolayer is placed on top of the metal etching solution. The solution is stirred to aid the removal of the metal foil and the graphene monolayer is incubated with the metal etching solution for an incubation time of 2 to 60 minutes. In addition, electric current can be applied to shorten the metal etching time to less than 1 minute.

In step (b) of the method of the invention, the liquid present in the equipment is eluted by opening a computer-controlled valve (14) until before the emptying is completed, followed by pouring a neutralising solution by opening a computer-controlled valve (15) until the neutralised solution arrives at a final pH value of 5 to 7. The pH of the neutralised solution is checked automatically by analysing the pH of the solution eluting from valve (14). The graphene monolayer is incubated with the neutralised solution for an incubation time of 5 to 30 minutes.

In step (c) of the method of the invention, the liquid present in the equipment is eluted by opening the computer-controlled valve (14) until before the emptying is completed, followed by pouring an acidic solution by opening a computer-controlled valve (16). The graphene monolayer (1) is incubated with the acidic solution for an incubation time of 5 to 30 minutes.

In step (d) of the method of the invention, the substrate (4) is inserted into the equipment through a ramp (8). Then, the liquid present in the equipment is removed by opening the computer-controlled valve (14) until the complete draining of the liquid, followed by the deposition of the graphene monolayer (1) on said substrate (4).

After step (d) of the method of the invention, the polymer layer (3) can be removed.

A particular embodiment is the method of the invention, wherein said substrate (4) is selected from the group composed by semiconductor materials, polymers, metals, patterned wafers and ceramics. In particular, said substrate (4) is selected from the group composed by quartz, glass, silicon, silicon with a thermal oxide layer, polyethylene naphthalate (PEN) and polyethylene terephthalate (PET)

A particular embodiment is the method of the invention, wherein said metal layer (2) is selected from the group composed by copper, nickel, gold, silver, aluminium, platinum, palladium, ruthenium, and iridium layers.

A particular embodiment is the method of the invention, wherein said metal layer (2) is an alloy layer.

A particular embodiment is the method of the invention, wherein said polymer layer (3) is selected from the group composed by polymethyl methacrylate (PMMA), polydimethyl siloxane (PDMS) and polycarbonate (PC) layers.

A particular embodiment is the method of the invention, wherein said metal etching solution is selected from the group composed by ferric chloride, nitric acid, ammonium persulfate and hydrogen peroxide.

The metal etching solution will vary depending on the metal layer (2). If the metal is copper, ferric chloride, ammonium persulfate and nitric acid could be used among others.

A particular embodiment is the method of the invention, wherein the metal layer (2) is incubated with the metal etching solution in step (a) for an incubation time from 2 to 60 minutes. More particularly, the incubation time in step (a) is from 2 to 30 minutes.

A particular embodiment is the method of the invention, wherein the neutralising solution in step (b) is poured until the neutralised solution arrives at a final pH value from 5 to 7. More particularly, the neutralising solution in step (b) is poured until the neutralised solution arrives at a final pH value from 6 to 7.

A particular embodiment is the method of the invention, wherein the graphene monolayer (1) is incubated with the neutralised solution in step (b) for an incubation time from 5 to 30 minutes. More particularly, the incubation time is from 5 to 10 minutes.

A particular embodiment is the method of the invention, wherein the graphene monolayer (1) is incubated with the acidic solution in step (c) for an incubation time of 5 to 30 minutes. More particularly, the incubation time is from 5 to 10 minutes.

A particular embodiment is the method of the invention, wherein the graphene monolayer (1) is cleaned with water after step (c).

In addition, the method of the invention could be applied to dope the monolayer graphene layers by exposing them to different chemical dopants.

Thus, a particular embodiment is the method of the invention, wherein the graphene monolayer is doped by exposing the graphene monolayer to chemical dopants.

Different chemical dopants can be used, as gold chloride, hydrochloric acid, nitric acid, sulfuric acid and metal particle solutions.

EXAMPLES OF THE INVENTION

Example 1

Figure 1:
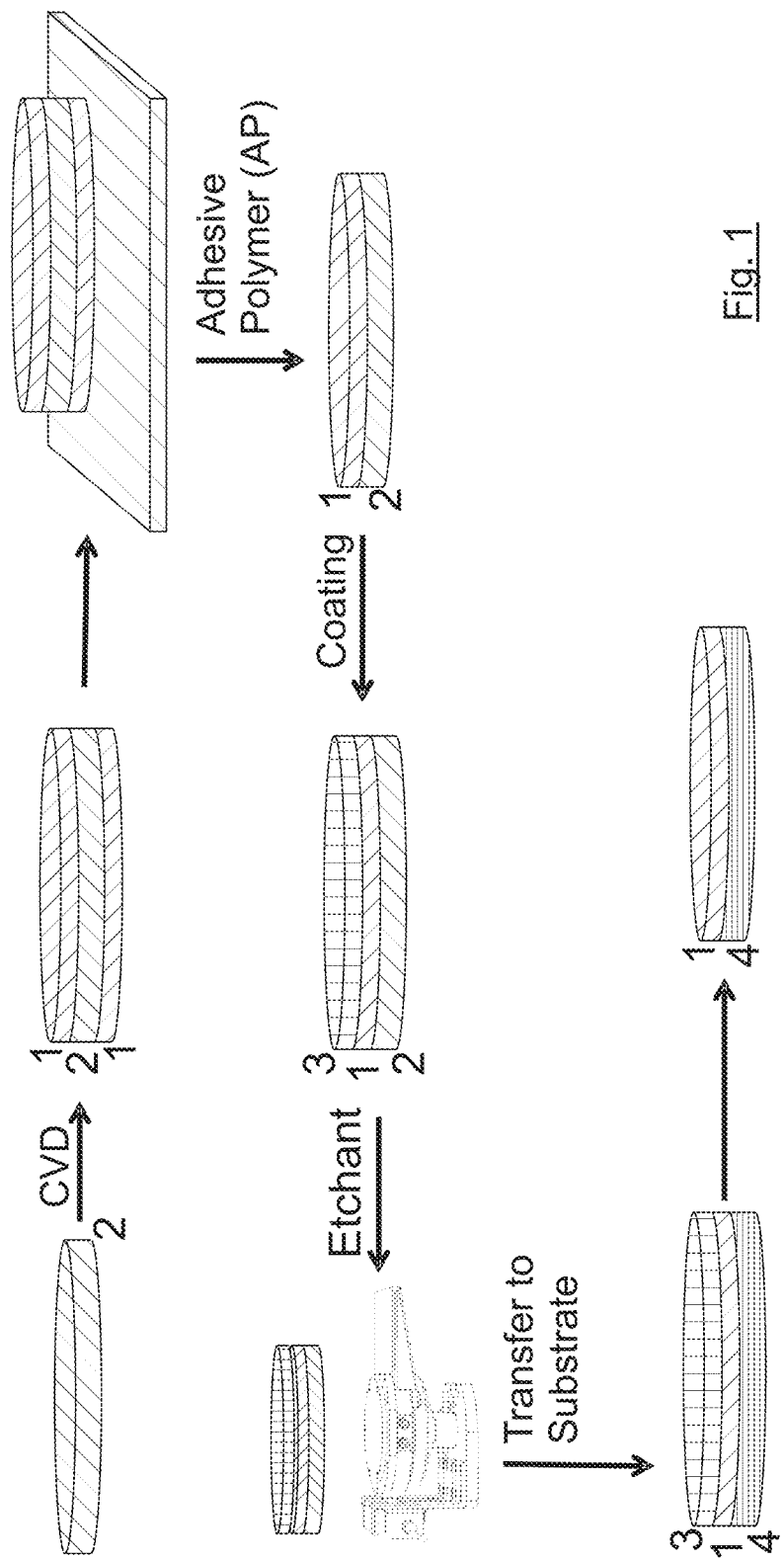
FIG. 1 shows a scheme of a graphene production method by chemical vapour deposition (CVD), graphene monolayer transfer according to the method and equipment of the invention and further removal of the polymethyl methacrylate (PMMA) polymer layer.
Figure 2:
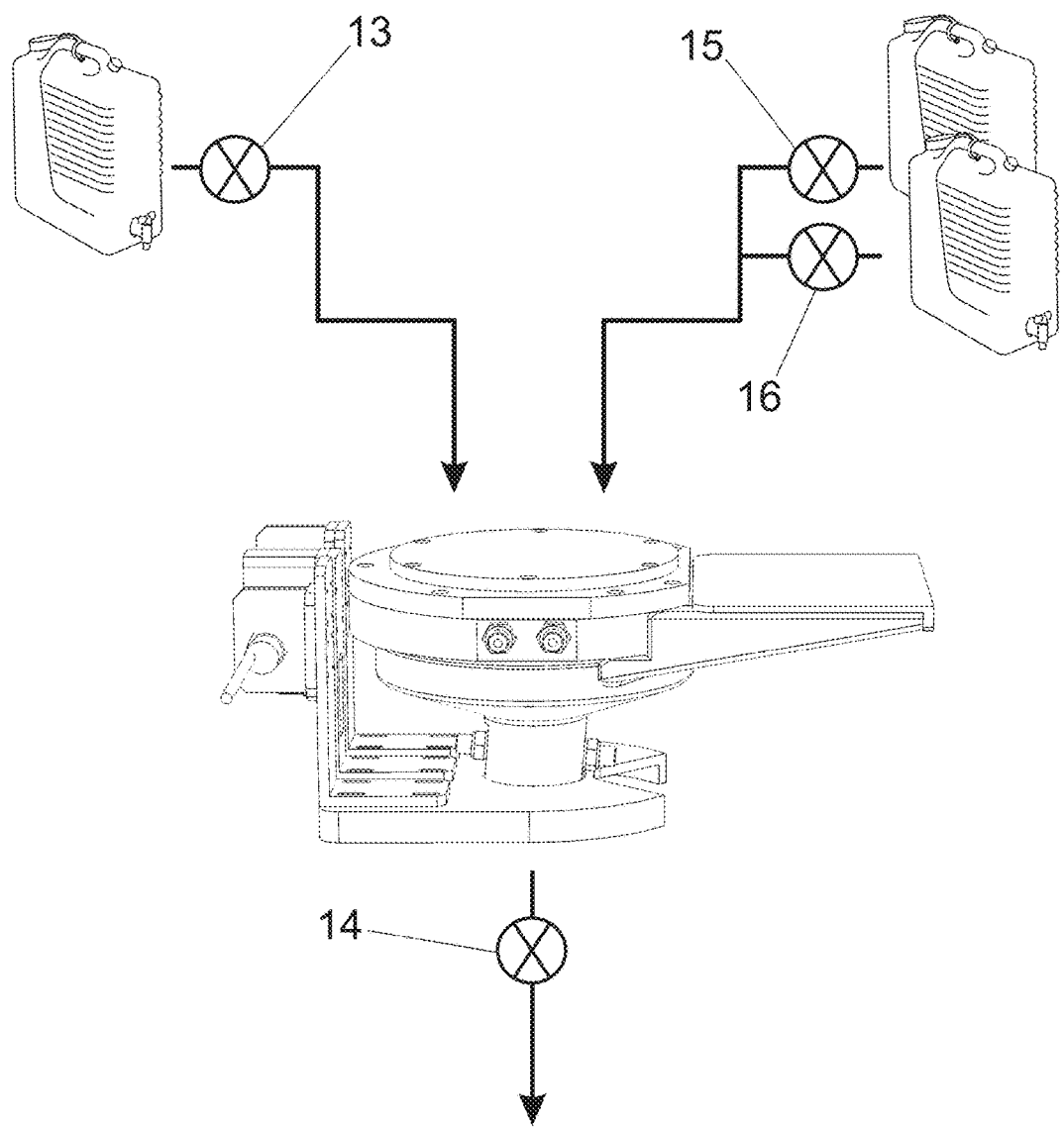
FIG. 2 shows a scheme of the equipment elements used in the graphene monolayer transfer method and equipment of the invention.
Figure 3:
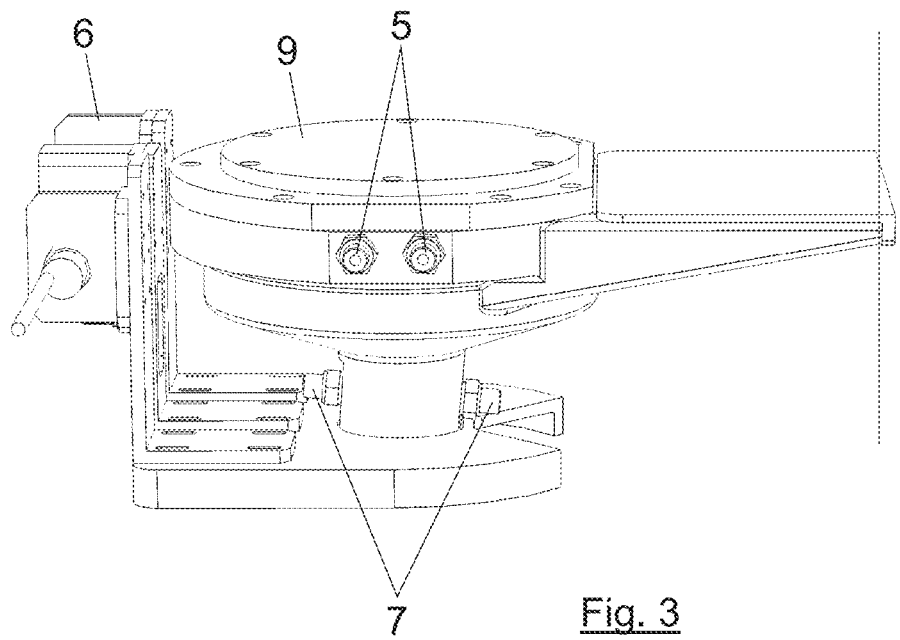
FIG. 3 shows a scheme of the equipment to automatically transfer a graphene monolayer of the invention.

A ferric chloride based copper etching solution (50:50 hydrochloric acid:water, 10 wt % of ferric chloride) was added into the conical vessel of the transfer equipment (FIG. 2). Then, a 100 mm in diameter graphene sample that was grown on copper foil and protected with PMMA (PMMA was placed on top of the graphene layer) was placed on the etching solution. The stirring speed was set to 150 rpm and in 12 minutes all the copper had been etched away. While eluting the etchant (by opening valve 14), a neutralising solution (distilled water) was added until the pH of the solution achieved 6-7. The graphene/PMMA film was cleaned for 5 minutes with the neutralising solution under constant stirring. Then, 100 mL of an acidic solution (hydrochloric acid 20%) was added at the same time as the draining of the previous solution took place. The graphene/PMMA film was kept in the acidic solution for 5 minutes. Finally this last solution was neutralised by the addition of distilled water and the film was kept there for 5 more minutes. Once the graphene/PMMA film was clean, the solution was removed and the film deposited automatically onto a 100 mm 300 nm $SiO_2$/Si wafer.

All the process was performed automatically using a predefined computer controlled programme and with the aid of sensors.

The PMMA layer was removed using organic solvents (acetone).

Figure 4:
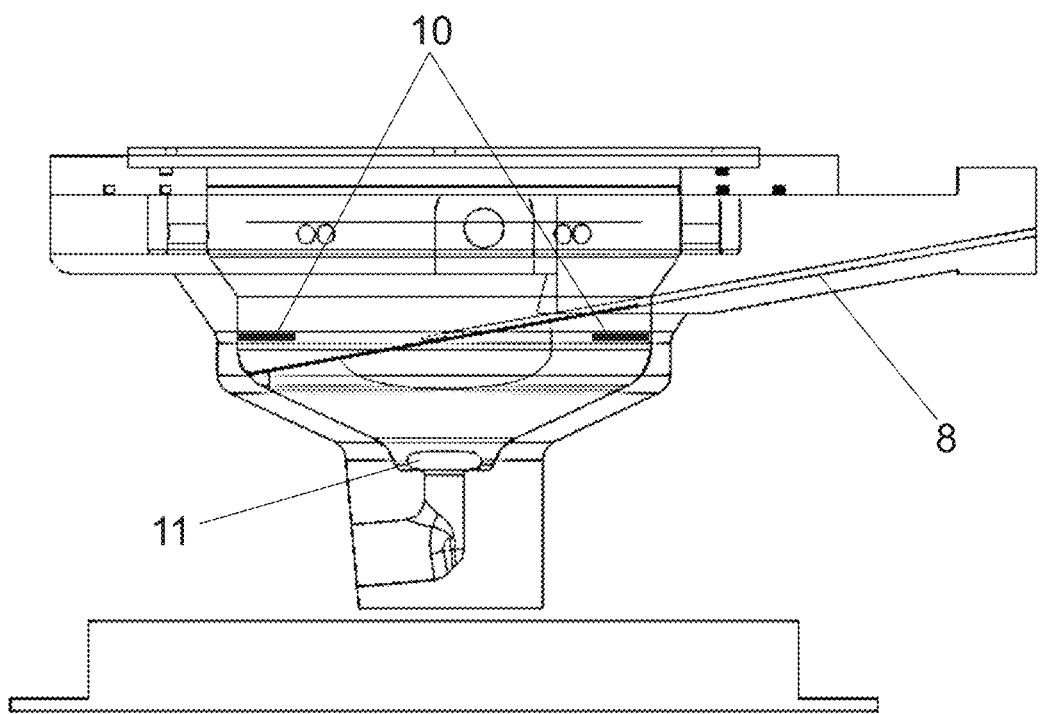
FIG. 4 shows a scheme of the equipment to automatically transfer a graphene monolayer of the invention, showing elements of the interior of the equipment.
Figure 5:
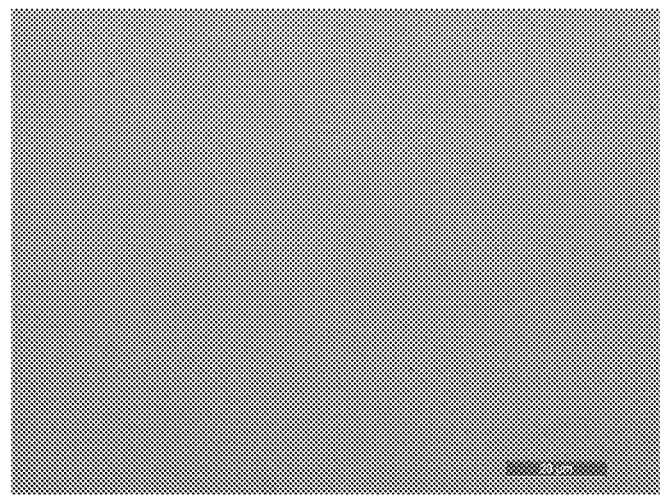
FIG. 5 shows an optical microscopy image of graphene produced in example 1.
Figure 6:
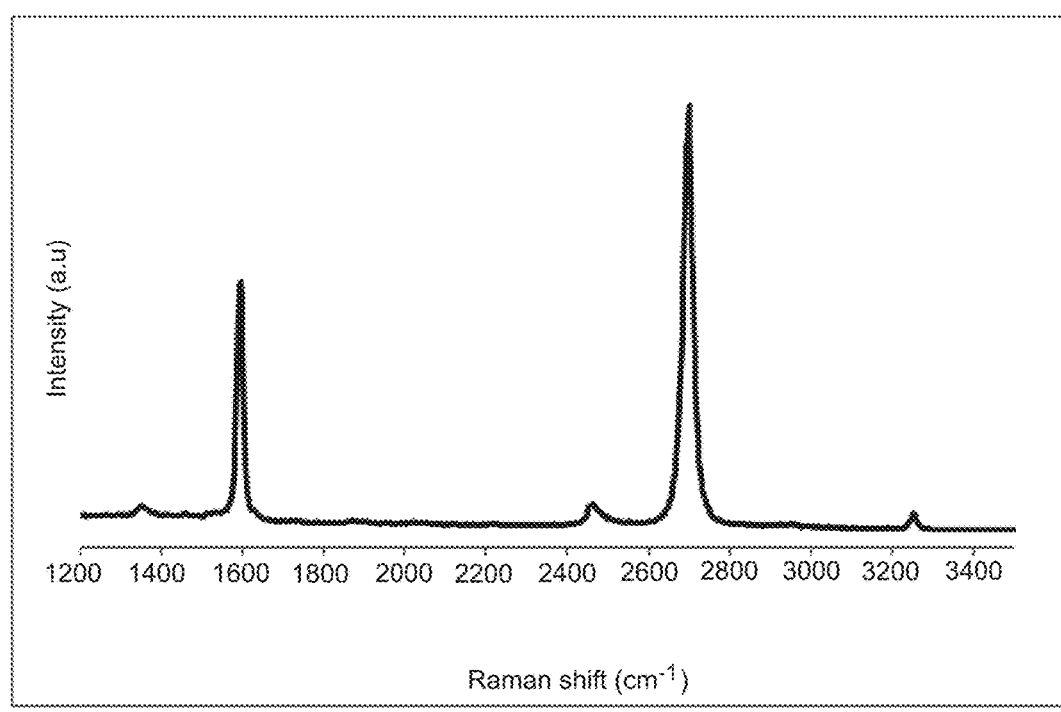
FIG. 6 shows the Raman spectrum of graphene produced in example 1.

The homogeneity and quality of the graphene was evaluated using optical microscopy and Raman spectroscopy. It can be observed that the graphene transfer is very clean and uniform with a very low amount of imperfections (FIG. 4). Moreover, Raman spectroscopy confirmed the high quality of the manufactured graphene film (FIG. 5).

Example 2

An ammonium persulfate based copper etching solution (APS, Transene) was added into the conical vessel of the transfer equipment (FIG. 2). Then, a 76 mm diameter graphene sample that was grown on copper foil and protected with PMMA (PMMA was placed on top of the graphene layer) was placed on the etching solution. The stirring speed was set to 100 rpm and in 18 minutes all the copper had been etched away. While eluting the etchant (by opening valve 14), a neutralising solution (distilled water) was added until the pH of the solution achieved 6-7. The graphene/PMMA film was cleaned for 5 minutes with the neutralising solution under constant stirring. Then, 100 mL of an acidic solution (hydrochloric solution 20%) was added at the same time as the draining of the previous solution took place. The graphene/PMMA film was kept in the acidic solution for 5 minutes. Finally this last solution was neutralised by the addition of water and the film was kept there for 5 more minutes. Once the graphene/PMMA film was clean, the solution was removed and the film deposited automatically onto a 76 mm 300 nm $SiO_2$/Si wafer.

All the process was performed automatically using a predefined computer controlled programme and with the aid of sensors.

The PMMA layer was removed using organic solvents (acetone).

Figure 7:
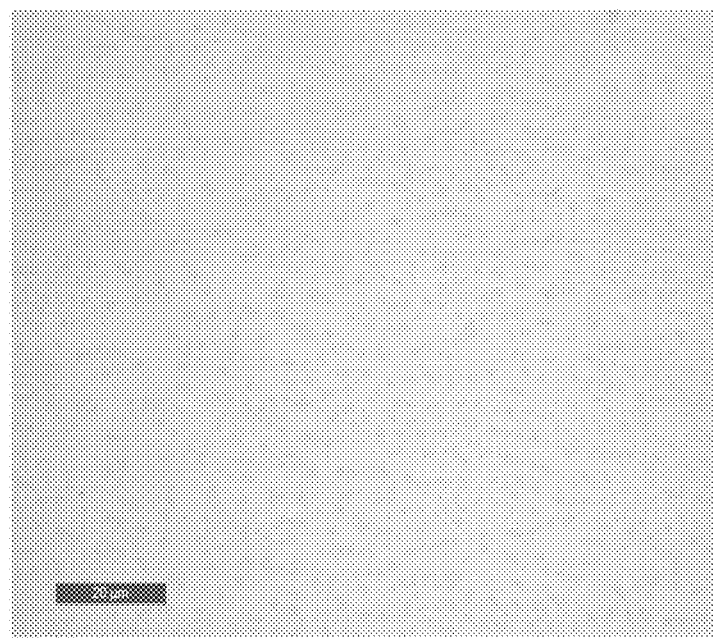
FIG. 7 shows an optical microscopy image of graphene produced in example 2.
Figure 8:
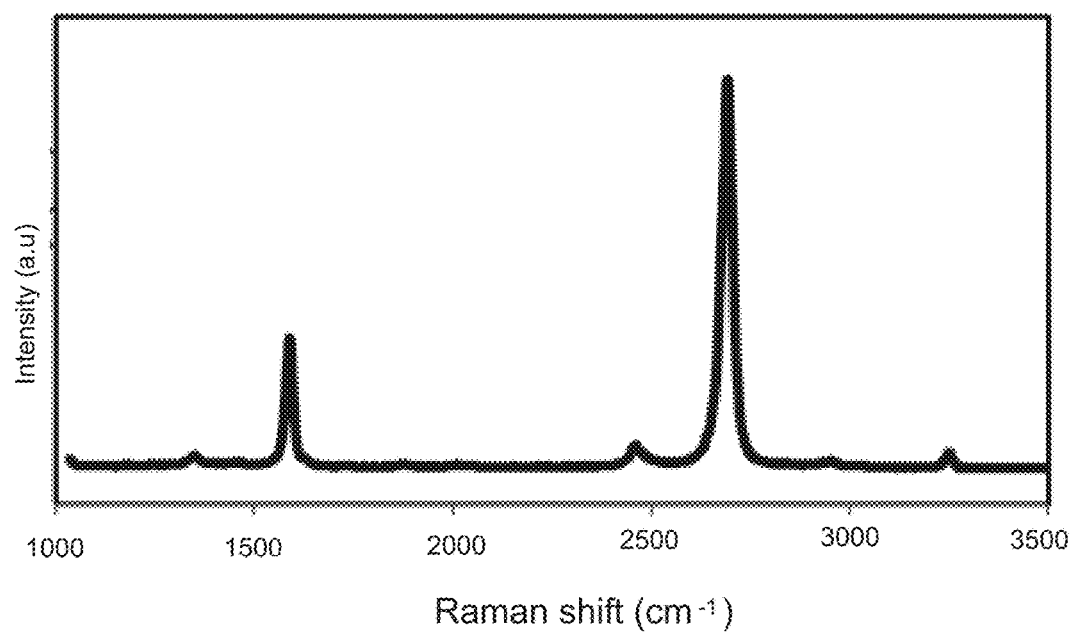
FIG. 8 shows the Raman spectrum of graphene produced in example 2.

The homogeneity and quality of the graphene was evaluated using optical microscopy and Raman spectroscopy. It can be observed that the graphene transfer is very clean and uniform with a very low amount of imperfections (FIG. 7). Moreover, Raman spectroscopy confirmed the high quality of the manufactured graphene film (FIG. 8).

Example 3

A ferric chloride based copper etching solution (50:50 hydrochloric acid:water, 10 wt % of ferric chloride) was added into the transfer equipment by opening valve 13 (using a computer controlled pre-determined programme) until ¾ of the conical shaped container were filled (filling process was controlled with the aid of sensors). Then, a 100 mm diameter graphene sample that was grown on copper foil and protected with PMMA (PMMA was placed on top of the graphene layer) was placed on the etching solution. The stirring speed was set to 100 rpm and in 8 minutes all the copper had been etched away. While eluting the etchant (by opening valve 14), a neutralising solution (distilled water) was added until the pH of the solution achieved 6-7 by opening valve 15. The graphene/PMMA film was cleaned for 5 minutes with the neutralising solution under constant stirring. Then, 100 mL of an acidic solution (hydrochloric acid 20%) was added by opening valve 16 at the same time as the draining of the previous solution took place by opening valve 14. The graphene/PMMA film was kept in the acidic solution for 5 minutes. Finally this last solution was neutralised by the addition of distilled water by opening valve 15 and the film was kept there for 5 more minutes. Once the graphene/PMMA film was clean, the substrate was introduced through the ramp and the solution was removed. The film was automatically deposited onto a 100 mm quartz wafer.

All the process was performed automatically using a predefined computer controlled programme and with the aid of sensors.

The PMMA layer was removed using organic solvents (acetone).

The invention claimed is:

1. A device comprising:
   a vessel adapted to automatically transfer a graphene monolayer deposited on a metal layer and protected with a polymer layer to a substrate, the vessel comprising a volume having a top section, a bottom section, and a middle section between the top section and the bottom section, the volume having a plurality of round cross-sections in a plurality of planes, the plurality of cross-sections including a first cross-section located in the bottom section and having a first radius, a second cross-section located in the middle section and having a second radius larger than the first radius, and a third cross-section located in the top section and having a third radius larger than the second radius,
   at least one first computer-controlled valve adapted to allow entry of first liquids into the vessel, the at least one first computer-controlled valve being disposed in the top section,
   at least one first sensor adapted to control a level and pH of a second liquid disposed in the vessel,
   at least one second computer-controlled valve adapted to drain third liquids from the vessel, the at least one second computer-controlled valve being disposed in the bottom section,
   a stirring element adapted to homogenize a mixture comprising one or more liquids, the stirring element disposed in the bottom section,
   a plurality of supports adapted to support the substrate, the plurality of supports being located in a plane located in the middle section of the volume,
   a ramp adapted to feed the substrate into the vessel, the ramp having a first portion disposed outside the vessel and a second portion disposed inside the vessel, the ramp intersecting a side of the vessel in the middle section of the vessel, the ramp forming a selected angle with one or more of the plurality of planes, the ramp extending into the vessel and intersecting with the plane associated with the plurality of supports, and
   a computer-controlled unit configured to control liquid handling, etching of the metal layer, and positioning of the graphene monolayer on the substrate.

2. The device according to claim 1, further comprising:
   a shower adapted to dispense the third liquids.

* * * * *